(12) United States Patent
Li et al.

(10) Patent No.: US 9,715,143 B2
(45) Date of Patent: Jul. 25, 2017

(54) DISPLAY PANEL, DISPLAYER AND DRIVING METHOD

(71) Applicant: BOE Technology Group Co., Ltd., Beijing (CN)

(72) Inventors: Pan Li, Beijing (CN); Wenbo Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/577,421

(22) Filed: Dec. 19, 2014

(65) Prior Publication Data

US 2016/0011450 A1 Jan. 14, 2016

(30) Foreign Application Priority Data

Jul. 11, 2014 (CN) .......................... 2014 1 0331730

(51) Int. Cl.
*G09G 5/10* (2006.01)
*G02F 1/13363* (2006.01)
(Continued)

(52) U.S. Cl.
CPC ......... *G02F 1/13363* (2013.01); *G09G 5/005* (2013.01); *H01L 27/3218* (2013.01);
(Continued)

(58) Field of Classification Search
CPC ..................... G09G 2340/10; G02F 1/13363
See application file for complete search history.

(56) References Cited

U.S. PATENT DOCUMENTS

2010/0238097 A1 9/2010 Baik et al.
2012/0293750 A1 11/2012 Yeh et al.
(Continued)

FOREIGN PATENT DOCUMENTS

CN 101425274 A 5/2009
CN 101840073 A 9/2010
(Continued)

OTHER PUBLICATIONS

First Office Action, including Search Report, for Chinese Patent Application No. 201410331730.X, dated Apr. 26, 2016, 14 pages.
(Continued)

*Primary Examiner* — Lixi C Simpson
(74) *Attorney, Agent, or Firm* — Westman, Champlin & Koehler, P.A.

(57) ABSTRACT

The present invention discloses a display panel, a displayer and a drive method for an array substrate in a display panel. The display panel comprises a cell substrate and an array substrate. Sub-pixel units of the array substrate are classified into first type of sub-pixel units for displaying an original image and second type of sub-pixel units for displaying an interference image. The outermost side of the cell substrate is provided with a FPR film array, wherein, first FPR films are in correspondence to the first type of sub-pixel units so as to convert emitting light of the first type of sub-pixel units into polarized light in a first direction; and a second FPR film is in correspondence to the second type of sub-pixel units so as to convert emitting light of the second type of sub-pixel units into polarized light in a second direction different from the first direction. The displayer may show the original image as well as the interference image simultaneously, and only wearing glasses for filtering interference image can the user observes the normal original image so as to prevent the (Continued)

original image from being observed by a peeper with his/her naked eyes.

11 Claims, 3 Drawing Sheets

(51) Int. Cl.
    *G02F 1/1362*      (2006.01)
    *H01L 27/32*      (2006.01)
    *G09G 5/00*      (2006.01)
    *H01L 51/52*      (2006.01)
    *G02F 1/1343*      (2006.01)

(52) U.S. Cl.
    CPC ............ *G02F 2001/133631* (2013.01); *G02F 2001/134345* (2013.01); *G09G 2310/08* (2013.01); *G09G 2340/10* (2013.01); *H01L 51/5293* (2013.01)

(56) References Cited

U.S. PATENT DOCUMENTS

| 2013/0002652 A1* | 1/2013 | Woo ................. G02B 27/26 345/419 |
| --- | --- | --- |
| 2013/0076785 A1* | 3/2013 | Chen ................. G09G 3/001 345/629 |
| 2013/0103943 A1* | 4/2013 | Hirsch ................. G09C 5/00 713/168 |
| 2015/0085002 A1 | 3/2015 | Li et al. |
| 2015/0146141 A1* | 5/2015 | Kim ................. G02F 1/13306 349/98 |

FOREIGN PATENT DOCUMENTS

| CN | 102857773 A | 1/2013 |
| --- | --- | --- |
| CN | 103293756 A | 9/2013 |

OTHER PUBLICATIONS

Second Office Action for Chinese Patent Application No. 201410331730.X, dated Oct. 19, 2016, 12 pages.
Rejection Decision for Chinese Patent Application No. 201410331730.X, dated Mar. 24, 2017, 16 pages.

\* cited by examiner

DISPLAY PANEL, DISPLAYER AND DRIVING METHOD

CROSS-REFERENCE TO RELATED APPLICATION

This application claims the benefit of Chinese Patent Application No. 201410331730.X filed on Jul. 11, 2014 in the State Intellectual Property Office of China, the whole disclosure of which is incorporated herein by reference.

BACKGROUND OF THE INVENTION

Field of the Invention

The present invention relates to a field of display technology, and more particularly, relates to a display panel, a displayer and a drive method for an array substrate in the display panel.

Description of the Related Art

Presently, a Liquid Crystal Display (LCD) has various kinds of auxiliary features, such as touch, 3 dimensions (3D) displaying, flexible and the like. Furthermore, green displayer having features of thin structure, low power consumption and multi-function has already been developed.

During the development of liquid crystal display technology, in view of the drawbacks of the products itself, such as visual angel-based problem existing in liquid crystal molecule itself, many kinds of liquid crystal displays having wide visual angle mode, such as Advanced Super Dimension Switch (ADSDS, or ADS for short), In-Plane Switching (IPS) and Multi-domain Vertical Alignment (MVA), have been developed. For example, by means of the narrow visual angle feature of liquid crystal molecule itself, normal display zone is only limited within a narrow front visual angle zone, display information in both left and right sides thus cannot be observed clearly so as to produce privacy protection effect to some extent. However, the person, stealing privacy information intentionally or unintentionally, always stands behind the user or captures the information with an invisible camera, which may capture the display information clearly within certain range of visual angle without being noticed by the user. Hence, the privacy of the user cannot be protected effectively by means of narrow visual angle mode showing image only in the front visual angle zone, which may cause the leakage of privacy of the user in some circumstance.

To sum up, the displayer in prior art cannot output the original image while outputting the interference image, so that the original image can be observed by the peeper with their naked eyes, which may cause the leakage of original image information.

SUMMARY OF THE INVENTION

The present invention provide a display panel, a displayer and a drive method for an array substrate in a display panel, the displayer may show the original image as well as the interference image at the same time, and only wearing glasses for filtering interference image may the user observes the normal original image so as to prevent the original image from being observed by a peeper with his/her naked eyes, which may cause the leakage of the information of original image.

In one aspect of the present invention, there is provided a display panel, comprising:

an array substrate comprising a plurality of gate lines, a plurality of data lines and a plurality of sub-pixel units each surrounded by adjacent gate lines and adjacent data lines, wherein, the sub-pixel units are classified into first type of sub-pixel units for displaying an original image and second type of sub-pixel units for displaying an interference image, and a pixel unit is composed of a plurality of adjacent first type of sub-pixel units and a plurality of adjacent second type of sub-pixel units; and a cell substrate, the outermost side of the cell substrate being provided with a FPR film array, the FPR film array comprising:

first FPR films corresponding to the first type of sub-pixel units so as to convert emitting light of the original image of the first type of sub-pixel units into polarized light in a first direction; and a second FPR film corresponding to the second type of sub-pixel units so as to convert emitting light of the interference image of the second type of sub-pixel units into polarized light in a second direction different from the first direction.

According to a further aspect of the present invention, there is provided a display device, comprising a displayer and a polarizing glasses. The displayer comprises the display panel according to above-mentioned embodiments and a signal process unit. The signal process unit comprises: a system board configured to input date signal of an original image; an image process unit configured to mix date signal of an interference image with data signal of the original image so as to output a mixed signal; and a time-controller configured to process the mixed signal and then output source driving signal to a source driver IC and gate driving signal to a gate driver IC, respectively. The polarizing glasses is configured to filter the interference image.

In a still aspect of the present invention, there is provided a drive method of an array substrate in a display panel, the array substrate comprising: a plurality of gate lines, a plurality of data lines and a plurality of sub-pixel units each surrounded by adjacent gate lines and adjacent data lines, wherein, the sub-pixel units are classified into first type of sub-pixel units for displaying an original image and second type of sub-pixel units for displaying an interference image, and a pixel unit is composed of a plurality of adjacent first type of sub-pixel units and a plurality of adjacent second type of sub-pixel units, the method comprising the following steps:

by an image process unit, acquiring each frame of the original image from a system board, and performing an anti-color process to each frame of the original image to acquire an anti-color image corresponding to each frame of the original image, and performing a superposition of the original image and the interference image so as to acquire an mixed image and then transmit the mixed image to a time-controller; and by the time controller, processing the mixed image and then transmitting data signal and gate signal to a source driver IC and a gate driver IC, respectively, so as to drive the first type of sub-pixel units to display each frame of the original image and drive the second type of sub-pixel units to display the anti-color image corresponding to each frame of the original image.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Embodiments of the display panel, the displayer, the display device and driving method thereof provided by embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The thickness of each film layer and the size and shape of each area in the attached drawings do not reflect the actual parameters of each component of the array substrate, but are intended for illustrating the embodiments of the present invention only. It should be noted that the display panel is exemplified by a liquid crystal display panel and the cell substrate is exemplified by a color filter substrate. Of course, the array substrate and cell substrate provided by the present invention are also applicable to an Organic Light-Emitting Diode (OLED) display panel.

Figure 1:
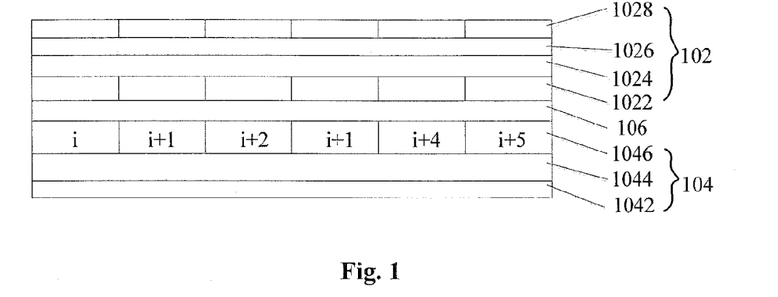
FIG. 1 is a partial sectional view of a liquid crystal display panel according to an embodiment of the present invention.
Figure 2:
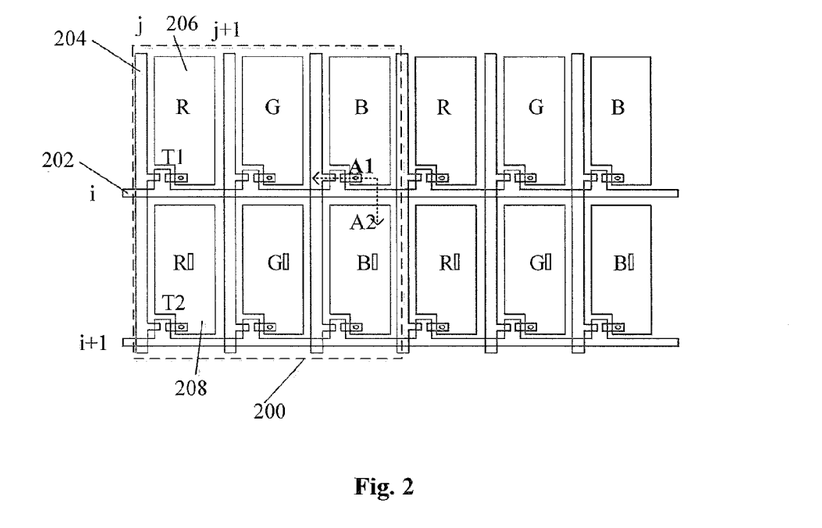
FIG. 2 is a partial plan view of an array substrate according to an embodiment of the present invention.

According to a general concept of the present invention, there is provided a liquid crystal display panel, as shown in FIG. 1, comprising a color filter substrate 102, an array substrate 104 and a liquid crystal layer 106 positioned between the color filter substrate 102 and the array substrate 104. As shown in FIG. 2, the array substrate 104 comprises a plurality of gate lines 202, a plurality of data lines 204 and a plurality of sub-pixel units each defined by adjacent gate lines 202 and adjacent data lines 204, such as red (R), green (G), blue (B) sub-pixel units and R', G' and B' sub-pixel units as shown in FIG. 2. The sub-pixel units are classified into first type of sub-pixel units for displaying an original image, such as the R, G and B sub-pixel units as shown in FIG. 2, and second type of sub-pixel units for displaying an interference image, such as the R', G' and B' sub-pixel units as shown in FIG. 2, wherein, a pixel unit is composed of a plurality of adjacent first type of sub-pixel units and a plurality of adjacent second type of sub-pixel units.

Figure 3:
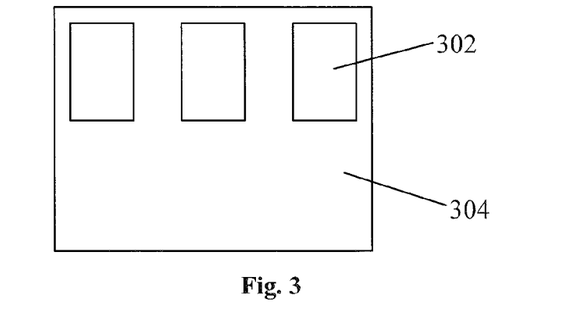
FIG. 3 is a schematic principle view of the arrangement of a FPR film array according to an embodiment of the present invention.

The color filter substrate 102 comprises: a color filter 1022, a first substrate 1024 provided on the color filter 1022, an upper polarizing filter 1026 provided on the first substrate 1024 and a Film-Type Patterned Retarder (FPR) film array 1028 provided on the upper polarizing filter 1026. As shown in FIG. 3, the FPR film array 1028 comprises first FPR films and a second FPR film, wherein the first FPR films 302 are in correspondence to the first type of sub-pixel units, such as the sub-pixel units of an i-th line, an (i+2)-th line and an (i+4)-th line as shown in FIG. 1, so as to convert the emitting light of the original image from the first type of sub-pixel units into a polarized light in a first direction; and the second FPR film 304 is in correspondence to the second type of sub-pixel units, such as the sub-pixel units of an (i+1)-th line, an (i+3)-th line and an (i+5)-th line as shown in FIG. 1, so as to convert the emitting light of the interference image from the second type of sub-pixel units into a polarized light in a second direction different from the first direction.

In an exemplary embodiment, the light emitted from the sub-pixel units of an i-th line, an (i+2)-th line . . . is converted into a left-handed (or laevogyrate) light by the first FPR films 302, and the light emitted from the sub-pixel units of an (i+1)-th line, an (i+3)-th line . . . is converted into the right-handed (or dextrogyrate) light by the second FPR film 304. In this way, the image observed by the user is a gray image without using a special tool, so as to protect display content on display panel effectively and prevent the privacy of a user from leaking. In an embodiment, the array substrate 104 comprises a lower polarizing filter 1042, a second substrate 1044 provided on the lower polarizing filter 1042 and a pixel array 1046 provided on the second substrate 1044, such as the pixel array as shown in FIG. 2.

Figure 4:
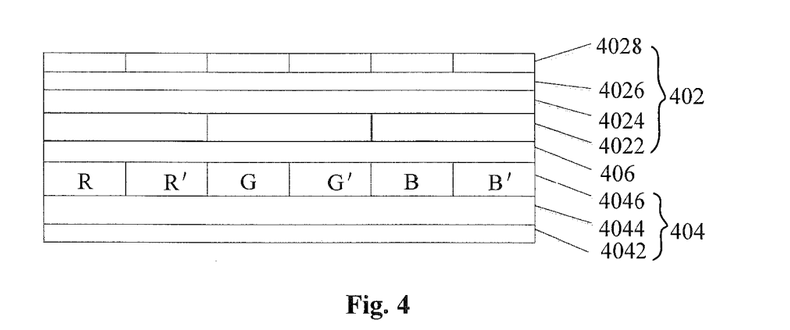
FIG. 4 is a partial sectional view of the liquid crystal display panel according to another embodiment of the present invention.
Figure 5:
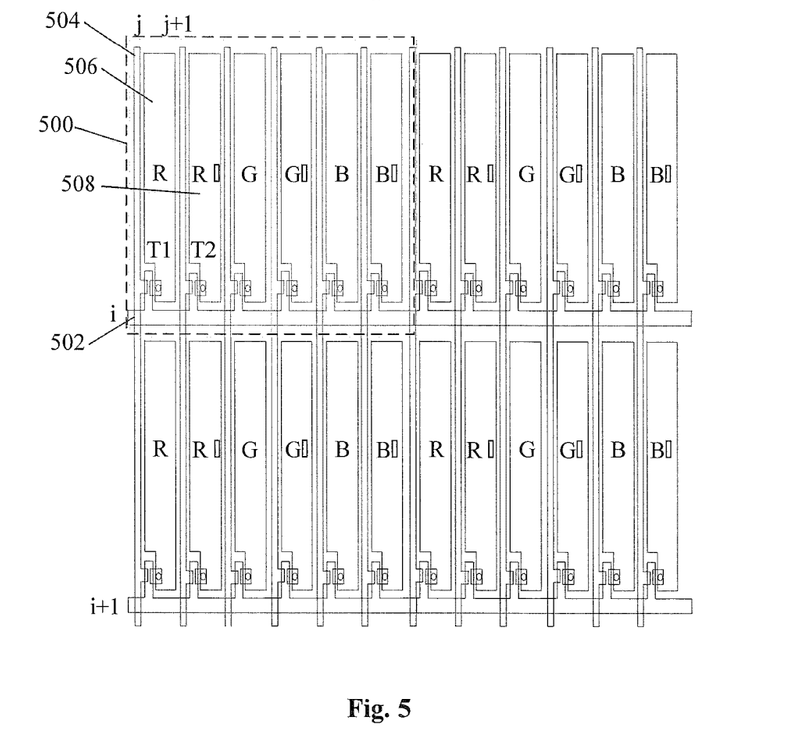
FIG. 5 is a partial plan view of the array substrate according to another embodiment of the present invention.

A liquid crystal display panel according to another exemplary embodiment of the present invention, there is provided, as shown in FIG. 4, comprises a color filter substrate 402, an array substrate 404 and a liquid crystal layer 406 between the color filter substrate 402 and the array substrate 404. As shown in FIG. 5, the array substrate 404 comprises a plurality of gate lines 502, a plurality of data lines 504 and a plurality of sub-pixel units each defined by adjacent gate lines 502 and adjacent data lines 504, such as red (R), green (G), blue (B) sub-pixel units and R', G' and B' sub-pixel units as shown in FIG. 5. The sub-pixel units are classified into first type of sub-pixel units for displaying an original image, such as the R, G and B sub-pixel units as shown in FIG. 5, and second type of sub-pixel units for displaying an interference image, such as the R', G' and B' sub-pixel units as shown in FIG. 5, wherein a pixel unit is composed of a plurality of adjacent first type of sub-pixel units and a plurality of adjacent second type of sub-pixel units.

Figure 6:
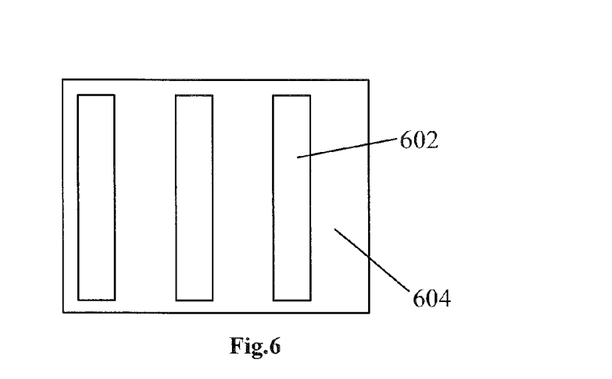
FIG. 6 is a schematic principle view of the arrangement of the FPR film array according to another embodiment of the present invention.

The color filter substrate 402 comprises: a color filter 4022, a first substrate 4024 provided on the color filter 1022, an upper polarizing filter 4026 provided on the first substrate 4024 and a Film-Type Patterned Retarder (FPR) film array 4028 provided on the upper polarizing filter 4026. As shown in FIG. 6, The FPR film array 4028 comprises first FPR films and a second FPR film, wherein the first FPR films 602 are in correspondence to the first type of sub-pixel units so as to convert the emitting light of the original image from the color filter substrate 402 into a polarized light in a first direction; and the second FPR film 604 is in correspondence to the second type of sub-pixel units so as to convert the emitting light of the interference image from the color filter substrate 402 into a polarized light in a second direction different from the first direction.

In an exemplary embodiment, the light emitted from the R, G and B sub-pixel units is converted into a left-handed (or laevogyrate) light by the first FPR films 602, and the light emitted from the R', G' and B' sub-pixel units is converted into the right-handed (or dextrogyrate) light by the second FPR film 604. In this way, the image observed by the user is a gray image without using a special tool, so as to protect display content on display panel effectively and prevent the privacy of a user from leaking. In an embodiment, the array substrate 404 comprises a lower polarizing filter 4042, a second substrate 4044 provided on the lower polarizing filter 4042 and a pixel array 4046 provided on the second substrate 4044, such as the pixel array as shown in FIG. 5.

In the liquid crystal panel according to the embodiments of the present invention, the original image is displayed in the first type of sub-pixel units in the array substrate, and at the same time, the interference image is displayed in the second type of sub-pixel units; and the emitting light of the first type of sub-pixel units is converted into a light in the first direction by the first FPR films, and the emitting light of the second type of sub-pixel units is converted into a light in the second direction different from the first direction by the second FPR film. In this way, the original image displayed in each pixel unit is affected by the interference image, that's to say, the original image and interference image are observed by the user simultaneously, such that only the gray image is observed in the case of naked eyes and the original image displayed in the displayer may not be observed. Only wearing glasses for filtering interference image can the user observes the normal original image so as to protect display information on displayer effectively. As compared with the prior art that the original image are displayed within narrow visual angle range in a displayer, the liquid crystal panel according to the embodiments of the present invention may prevent the display information from being peeped by a peeper more effectively.

Certainly, it should be understood by the person skilled in this art that although the gray image created by combining the original image and the interference image is displayed in the displayer, after filtering the interference image by the glasses for filtering interference image, the user may still observe the original image so as not to impact the normal use.

To sum up, as shown in FIG. 1 and FIG. 4, the liquid crystal panel provided by the embodiments of the present invention is composed of the lower polarizing filter, the second substrate, a pixel array, a liquid crystal layer, the color filter, the first substrate, the upper polarizing filter, and the FPR film array from lower portion to upper portion.

In a liquid crystal display panel according to an exemplary embodiment, each pixel unit in the array substrate is substantially square-shape.

In the liquid crystal display panel provided by the embodiments of the present invention, by providing the shape of each pixel unit in the array substrate to be substantially square shape, the pixel density in the vertical direction of the array substrate is equivalent to that in the horizontal direction of the array substrate, such that the interference image displayed in the second type of sub-pixel units may interfere totally with the original image displayed in the first type of sub-pixel units so as to prevent the original image from being peeped by a peeper and thus the privacy information from leaking.

In a liquid crystal display panel according to an exemplary embodiment, each pixel unit in the array substrate comprises a plurality of lines of sub-pixel units, wherein the sub-pixel units in the same line is referred to as the first type of sub-pixel units or the second type of sub-pixel units, and the sub-pixel units in the adjacent lines are different types of sub-pixel units.

Specifically, in the above-mentioned array substrate provided by the embodiment of the present invention, as shown in FIG. 2, the pixel unit 200 is square-shaped and comprises six sub-pixel units arranged in two lines, wherein R, G and B sub-pixel units are arranged in sequence in the first line, and R', G' and B' sub-pixel units are arranged in sequence in the second line, and R sub-pixel unit lies in the same column as R' sub-pixel unit. The pixel unit 200 is driven by an i-th line gate line and an (i+1)-th line gate line, wherein the pixel driven by the i-th line gate line is displayed as the original image and the pixel driven by the (i+1)-th line gate line is displayed as the interference image.

In a liquid crystal display panel according to an exemplary embodiment, each of the first type of sub-pixel units comprises a first thin film transistor (TFT) T1 and a first pixel electrode 206, and each of the second type of sub-pixel units comprises a second thin film transistor (TFT) T2 and a second pixel electrode 208. In the first TFT T1 and the second TFT T2 located in the same column in the same pixel unit, a gate of the first TFT T1 is electrically connected to the i-th line gate line, a source of the first TFT T1 is electrically connected to the j-th column date line, and a drain of the first TFT T1 is electrically connected to the first pixel electrode 206 by a first via; and a gate of the second TFT T2 is electrically connected to the (i+1)-th line gate line, a source of the second TFT T2 is electrically connected to the j-th column date line, and a drain of the second TFT T2 is electrically connected to the second pixel electrode 208 by a second via, wherein, i and j are both natural number.

In the embodiment of the present invention, for sake of easy discrimination, the via for realizing the electrical connection between the source of the first TFT T1 and the first pixel electrode 206 is referred to as the first via hole, and the via for realizing the electrical connection between the source of the second TFT T2 and the second pixel electrode 208 is referred to as the second via hole.

In a liquid crystal display panel according to an exemplary embodiment, as shown in FIG. 5, each of the pixel units in the array substrate comprises a line of sub-pixel units, and the pixel unit 500 as shown in FIG. 5 comprises R, R', G, G', B and B' sub-pixel units, and the first type of sub-pixel units and the second type of sub-pixel units are arranged alternatively in each of the pixel units.

Specifically, in an array substrate according to another embodiment of the present invention, the pixel unit 500 is square-shaped and comprises six sub-pixel units and is driven by the i-th line gate line. The six sub-pixel units of R, R', G, G', B and B' in the pixel unit 500 are alternatively arranged and are driven by the i-th line gate line. The original image is transmitted by the j-th, (j+2)-th and (j+4)-th lines; and the interference image is transmitted by the (j+1)-th, (j+3)-th and (j+5)-th lines.

In an array substrate according to an exemplary embodiment, each of the first type of sub-pixel units comprises a first thin film transistor (TFT) T1 and a first pixel electrode 506, and each of the second type of sub-pixel units comprises a second thin film transistor (TFT) T2 and a second pixel electrode 508. In any pair of the first TFT T1 and the second TFT T2 adjacent to each other, a gate of the first TFT T1 is electrically connected to the i-th line gate line, a source of the first TFT T1 is electrically connected to the j-th column date line, and a drain of the first TFT T1 is electrically connected to the first pixel electrode 506 by a first via; and a gate of the second TFT T2 is electrically connected to the i-th line gate line, a source of the second TFT T2 is electrically connected to the (j+1)-th column date line, and a drain of the second TFT T2 is electrically connected to the second pixel electrode 508 by a second via, wherein, i and j are both natural number.

Certainly, in the embodiment of the present invention, for sake of easy discrimination, the via for realizing the electrical connection between the drain of the first TFT T1 and the first pixel electrode 506 is referred to as the first via hole, and the via for realizing the electrical connection between the drain of the second TFT T2 and the second pixel electrode 508 is referred to as the second via hole.

In a liquid crystal display panel according to an exemplary embodiment, each of pixel units comprises three first type of sub-pixel units of Red, Green and Blue and three second type of sub-pixel units of Red, Green and Blue (as shown in FIG. 2 and FIG. 5); alternatively, each of pixel units comprises four first type of sub-pixel units of Red, Green, Blue and white and four second type of sub-pixel units of Red, Green, Blue and white (not shown).

In the array substrate provided by the embodiment of the present invention, the gray value of the second type of sub-pixel units is an arbitrary value other than the gray value of the first type of sub-pixel units, since the interference effect may be achieved as long as the gray value of the interference image is not the same as the gray value of the original image. As an exemplary embodiment, in order to achieve much better interference effect and realize the display of grey image, the anti-color image signal of image data signal of the original image may be used as the image data signal of the interference image. To be specific, the largest gray value of an image is 255, for example, when the gray value of the original image displayed by the R sub-pixel unit is set as X, the gray value of the interference image displayed by the R' sub-pixel unit adjacent thereto in the same sub-pixel unit is set as (255−X).

In a liquid crystal display panel according to an exemplary embodiment, the first direction is opposite to the first direction.

In the display panel according to the above-mentioned embodiment, the light emitted from the first type of sub-pixel units is deflected to the first direction by the FPR film array, and the light emitted from the second type of sub-pixel units is deflected to the second direction different from the first direction by the FPR film array. In an exemplary embodiment, the second direction is opposite to the first direction. When the second type of sub-pixel units are required to display an interference image, i.e. when the content of the displayer needs to be protected, since the second direction is different from the first direction, the image displayed by the display panel is observed as gray image without using any special tool, that's to say, only gray image can be observed by the naked eyes so as to protect the content of the display panel.

Figure 7:
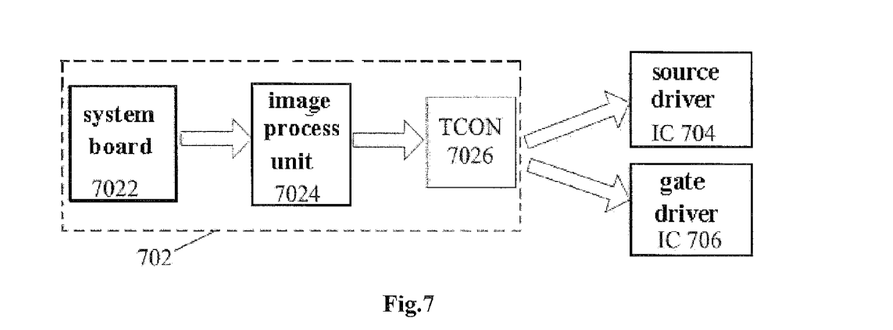
FIG. 7 is a schematic principle block diagram of signal process device of a displayer provided by the embodiments of the present invention.

There is provided a displayer by the embodiment of the present invention, comprising: a signal process device 702 and the liquid crystal display panel according to the embodiments of the present invention. To be specific, as shown in FIG. 7, the signal process device 702 comprises a system board 7022, an image process unit 7024 and a Time-Controller (TCON) 7026. The system board 7022 is configured to output the date signal of the original image to the image process unit 7024. The image process unit 7024 is configured to mix the date signal of the interference image with the date signal of the original image and then output the mixed signal to the TCON 7026. The TCON 7026 is configured to process the mixed signal and then output source drive signal to a source driver IC 704 and output gate drive signal to a gate driver IC 706.

In the displayer provided by the embodiments of the present invention, the date signal of the original image is mixed with the date signal of the interference image by the signal process device 702 so as to show original image as well as interference image simultaneously in the pixel unit. In this way, the original image displayed in each pixel unit is affected by the interference image, thereby only the gray image can be observed by the naked eyes and the original image displayed in the displayer cannot be observed. Only wearing glasses for filtering interference image can the user observes the normal original image so as to protect display information on displayer effectively. As compared with the prior art that the original image are displayed within narrow visual angle range in a displayer, the displayer according to the embodiments of the present invention may prevent the display information from being peeped by a peeper more effectively.

Specifically, the system board 7022 outputs a n-th frame of an original image to the image process unit 7024, and the image process unit 7024 performs an anti-color process for the n-th frame of the original image to obtain a n-th frame of an anti-color image. More, specifically, each pixel of the n-th frame of the original image is subject to the anti-color process, that's to say, if a RGB gray values of a pixel of the original image is (x, y, z), the RGB gray values of the pixel after the anti-color process is changed to (255−x, 255−y, 255−z), thus, the n-th frame of the anti-color image is obtained after the anti-color process of each pixel of the n-th frame of the original image is performed.

Next, the image process unit 7024 performs a superposition to the n-th frame of the original image and the n-th frame of the anti-color image so as to form a n-th frame of a mixed image. For instance, with regards to the array substrate configuration as shown in FIG. 2, from upper portion to lower portion, the first line is the first line pixel used for the original image, and the second line is the first line pixel used for the anti-color image, and the third line is the second line pixel used for the original image, and the fourth line is the second line pixel used for the anti-color image, and so forth. With regards to the array substrate configuration as shown in FIG. 5, from left to right, the first column is the first column pixel used for the original image, and the second column is the first column pixel used for the anti-color image, and the third column is the second column pixel used for the original image, and the fourth column is the second column pixel used for the anti-color image, and so forth.

The n-th frame of the mixed image is processed by the TCON 7026 (for time control) and then is output to the source driver IC (for outputting data signal) and the gate driver IC (for outputting gate signal) from the TCON 7026 so as to drive the display of the pixel.

The image process unit 7024 may comprise Field-Programmable Gate Array (FPGA), by which the image process function may be realized. It should be noted that the image process function may be realized by a customized and dedicated image process chip.

Certainly, the signal process unit 702 according to the embodiments of the present invention may realize a peeping-proof display of the displayer. Specifically, when the peeping-proof display is required, the signal process unit 702 may mix the date signal of the original image with the data signal of the interference image through the image process unit 7024 and output the mixed data signal to the TCON 7026 so as to realize the peeping-proof display and protect the content of the displayer effectively.

A display device provided by the embodiments of the present invention comprises a displayer provided by the embodiments of the present invention and polarizing glasses for filtering the interference image.

In the display device provided by the embodiments of the present invention, by means of the aforementioned displayer, the original image displayed in each pixel unit is affected by the interference image, such that only the gray image may be observed by the naked eyes and the original image displayed in the displayer cannot be observed. Only wearing glasses for filtering interference image can the user observes the normal original image so as to protect display information on displayer effectively. As compared with the prior art that the original image are displayed within narrow visual angle range in a displayer, the display device provided by the embodiments of the present invention may prevent the display information from being peeped by a peeper more effectively.

Certainly, it should be understood by the person skilled in this art that the display device may be a displayer, a cell-phone, a TV, a laptop and All-in-on PC. The display device is provided to prevent the display information from being peeped by other users. The users of the displayer may observe the normal image displayed in the displayer, thus, the polarizing direction of the polarizing glasses provided for the user of the displayer should concur with the deflection direction of the light deflection signal of the image signal of the original image in the displayer so as to filter the image signal of the interference image.

As a more specific embodiment, in the state of the peeping-proof display of the display device, the emitting light from the original image may be deflected to left-handed light, and the emitting light from the interference image may be deflected to right-handed light, thereby only gray image in the displayer may be observed by the naked eyes. If the polarizing glasses mated with the displayer is wore, for instance, the wearing left-handed circular polarizing glasses may filter the right-handed light so as to merely show the original image of the left-handed light, thereby, in the case of wearing polarizing glasses, the original image may be observed. On the contrary, in the case of wearing no polarizing glasses, only gray image may be observed so as to achieve the effective protection of the content in the displayer.

A drive method for the array substrate in a display panel is also provided by the embodiments of the present invention. The array substrate comprises a plurality of gate lines, a plurality of data lines and a plurality of sub-pixel units each defined by adjacent gate lines and adjacent data lines. The sub-pixel units are classified into a first type of sub-pixel units for showing an original image and a second type of sub-pixel units for showing an interference image, wherein a pixel unit is composed of a plurality of adjacent first type of sub-pixel units and a plurality of adjacent second type of sub-pixel units. The driving method comprises the following steps:

By an image process unit, acquiring each frame of the original image from a system board by an image process unit, and performing an anti-color process to each frame of the original image to acquire an anti-color image corresponding to each frame of the original image, and performing a superposition of the original image and the interference image so as to acquire mixed image and then transmit the mixed image to a TCON; and by the TCON, processing the mixed image and then transmitting data signal and gate signal to a source driver IC and a gate driver IC, respectively, so as to drive the first type of sub-pixel units to display each frame of the original image and drive the second type of sub-pixel units to display the anti-color image corresponding to each frame of the original image.

In the drive method for the array substrate in a display panel provided by the embodiments of the present invention, the image process unit performs an anti-color process to each frame of the original image to acquire an anti-color image corresponding to the original image, and performs a superposition of the original image and the interference image so as to display the original image in the first type of sub-pixel units and display the interference image in the second type of sub-pixel units, in each pixel unit. In this way, the original image displayed in each pixel unit is affected by the interference image; thereby only the gray image can be observed by the naked eyes and the original image displayed in the displayer cannot be observed. Only wearing glasses for filtering interference image can the user observes the normal original image so as to protect display information on displayer effectively. As compared with the prior art that the original image are displayed within narrow visual angle range in a displayer, the display device provided by the embodiments of the present invention may prevent the display information from being peeped by a peeper more effectively In a detailed embodiment, the method for acquiring an anti-color image is embodied as that each pixel of the n-th frame of the original image is subject to an anti-color process, that's to say, if a RGB gray values of an pixel of the original image is (x, y, z), the RGB gray values of the pixel after the anti-color process is changed as (255−x, 255−y, 255−z), the n-th frame of the anti-color image is obtained after the anti-color process of each pixel of the n-th frame of original image is performed.

Figure 8:
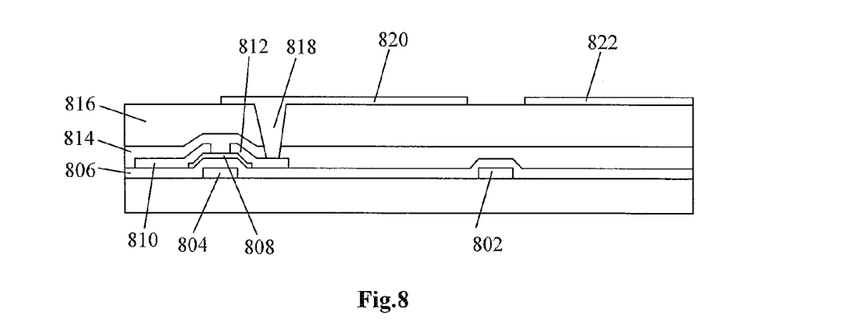
FIG. 8 is a sectional view of the array substrate of FIG. 1 taken along line A1-A2 in FIG. 2.

In the following, taking the structure of the array substrate in above embodiment for instance, the method for manufacturing the array substrate will be described in details in combination with FIG. 8:

Step 1: performing sputter on the second substrate of the array substrate to deposit a metal layer, such as Aluminum, and performing a first patterning process, including applying photoresist, exposing, developing, etching, to form patterns of gate lines and gates 802;

Step 2: depositing a gate insulator layer 806, such as SiN, by Plasma Enhanced Chemical Vapor Deposition (PEVCD) method;

Step 3: depositing a semi-conductor layer, for example, depositing a-Si layer by PEVCD method or depositing Indium Gallium Zinc Oxide (IGZO) by a sputter process; performing a second patterning process, including applying photoresist, exposing, developing, etching, to form a pattern of active layer 808;

Step 4: depositing a metal layer, such as Aluminum, by a sputter process, and performing a third patterning process, including applying photoresist, exposing, developing, etching, to form patterns of date lines, sources 810 and drains 812;

Step 5: depositing a passivation layer 814, for example a SiN layer, by PEVCD method, and then applying a resin layer 814; performing a fourth patterning process, including applying photoresist, exposing, developing, etching, to form patterns of vias 818; a drain 812 of a TFT being exposed by the via 818;

Step 6: forming transparent metallic oxide conductive material layer, for example N-type oxide semi-conductor, such as Indium Tin Oxides (ITO), performing a fifth patterning process, including applying photoresist, exposing, developing, etching, to form patterns of a first type of sub-pixel units 820 and a second type of sub-pixel units 822.

In the embodiment of the present invention, the resin layer 816 is provided on the passivation layer 814 of the array substrate. The date lines and gate lines may be made of metal material, such as Cu, Al, Mo, Ti, Cr, W and the alloy thereof, and the gate lines may be a single layer structure, and may also be multi-layer structure, such as Mo/Al/Mo, Ti/Cu/Ti, Mo/Ti/Cu. The gate insulator layer 806 may adopt SiN or SiO; and the gate insulator layer 806 may be a single layer structure and may also be multi-layer structure, such as SiO/SiN. The active layer 808 may adopt a-Si or oxide semi-conductor. The passivation layer 814 may adopt inorganic material, such as SiO. The resin layer 816 may adopt common resin, and may also adopt photosensitive resin. The pixel electrode 820 may be made of transparent conductive oxide material, such as IZO, ITO and the like.

According to the display panel, the displayer, the display device and the driving method thereof, the original image is displayed in the first type of sub-pixel units of the sub-pixel unit, and the interference image is displayed in the second type of sub-pixel units. The light emitted from the first type of sub-pixel units is deflected to the first direction by the first FPR films, and the light emitted from the second type of sub-pixel units is deflected to the second direction different from the first direction by the second FPR film. In this way, the original image displayed in each pixel unit is affected by the interference image; thereby only the gray image can be observed by the naked eyes and the original image displayed in the displayer cannot be observed. Only wearing glasses for filtering interference image can the user observes the normal original image so as to protect display information on displayer effectively.

Although several exemplary embodiments have been displayed and described, it would be appreciated by those skilled in the art that various changes or modifications may be made in these embodiments without departing from the principles and spirit of the disclosure, the scope of which is defined in the claims and their equivalents.

What is claimed is:

1. A display device, comprising:
 a display panel, comprising:
  an array substrate comprising a plurality of gate lines, a plurality of data lines and a plurality of sub-pixel units each defined by adjacent gate lines and adjacent data lines, wherein the sub-pixel units are classified into first type of sub-pixel units for displaying an original image and second type of sub-pixel units for displaying an interference image, and a pixel unit is composed of a plurality of adjacent first type of sub-pixel units and a plurality of adjacent second type of sub-pixel units; and
  a cell substrate, the outermost side of the cell substrate being provided with a FPR film array, the FPR film array comprising:
   first FPR films corresponding to the first type of sub-pixel units so as to convert emitting light of the original image of the first type of sub-pixel units into polarized light in a first direction; and
   a second FPR film corresponding to the second type of sub-pixel units so as to convert emitting light of the interference image of the second type of sub-pixel units into polarized light in a second direction different from the first direction; and
 a signal process unit, comprising:
  a system board configured to input date signal of an original image;
  an image process unit configured to mix date signal of an interference image with data signal of the original image so as to output a mixed signal, wherein anti-color image signal of the image signal of the original image is used as the image data signal of the interference image, the largest gray value of an image is 255, and when the gray value of the original image displayed by the first type of sub-pixel units is set as X, the gray value of the interference image displayed by the second type of sub-pixel units is set as (255-X), and
  a time-controller configured to process the mixed signal and then output source driving signal to a source driver IC and gate driving signal to a gate driver IC, respectively.

2. The display device according to claim 1, wherein, each pixel unit in the array substrate has substantially square-shaped.

3. The display device according to claim 1, wherein, each pixel unit in the array substrate comprises plural lines of sub-pixel units, the sub-pixel units in the same line being referred to as the first type of sub-pixel units or the second type of sub-pixel units, and the sub-pixel units in the adjacent lines being different types of sub-pixel units.

4. The display device according to claim 3, wherein, each of the first type of sub-pixel units comprises a first thin film transistor and a first pixel electrode, and each of the second type of sub-pixel units comprises a second thin film transistor and a second pixel electrode, wherein, in the first type of sub-pixel units and the second type of sub-pixel units located in the same column in the same pixel unit:
 a gate of the first thin film transistor is electrically connected to the i-th line gate line, a source of the first thin film transistor is electrically connected to the j-th column date line, and a drain of the first thin film transistor is electrically connected to the first pixel electrode by a first via; and
 a gate of the second thin film transistor is electrically connected to the (i+1)-th line gate line, a source of the second thin film transistor is electrically connected to the j-th column date line, and a drain of the second thin film transistor is electrically connected to the second pixel electrode by a second via, and
wherein, i and j are both natural number.

5. The display device according to claim 1, wherein, each pixel unit in the array substrate comprises a line of sub-pixel units, the first type of sub-pixel units and the second type of sub-pixel units being arranged alternatively in each pixel unit.

6. The display device according to claim 5, wherein, each of the first type of sub-pixel units comprises a first thin film transistor and a first pixel electrode, and each of the second type of sub-pixel units comprises a second thin film transistor and a second pixel electrode, wherein, in any pair of the first type of sub-pixel units and the second type of sub-pixel units adjacent to each other,
 a gate of the first thin film transistor is electrically connected to the i-th line gate line, a source of the first thin film transistor is electrically connected to the j-th column date line, and a drain of the first thin film transistor is electrically connected to the first pixel electrode by a first via; and a gate of the second thin film transistor is electrically connected to the i-th line gate line, a source of the second thin film transistor is electrically connected to the (j+1)-th column date line, and a drain of the second thin film transistor is electrically connected to the second pixel electrode by a second via, wherein, and i and j are both natural number.

7. The display device according to claim 1, wherein, each pixel unit comprises three first type of sub-pixel units of red, green and blue and three second type of sub-pixel units of red, green and blue; or each pixel unit comprises four first type of sub-pixel units of red, green, blue and white and four second type of sub-pixel units of red, green, blue and white.

8. The display device according to claim 1, wherein, the first direction is opposite to the second direction.

9. The display device according to claim 1, wherein, the polarizing direction of the polarizing glasses is consistent with the deflecting direction of deflection light signal of image signal of the original image in the displayer.

10. The display device according to claim 1, further comprising a polarizing glasses for filtering the interference image.

11. A drive method for an array substrate in a display panel, the array substrate comprising: a plurality of gate lines, a plurality of data lines and a plurality of sub-pixel units each defined by adjacent gate lines and adjacent data lines, wherein, the sub-pixel units are classified into first type of sub-pixel units for displaying an original image and second type of sub-pixel units for displaying an interference image, and a pixel unit is composed of a plurality of adjacent first type of sub-pixel units and a plurality of adjacent second type of sub-pixel units, the method comprising the following steps:

by an image process unit, acquiring each frame of the original image from a system board, and performing an anti-color process for each frame of the original image to acquire an anti-color image corresponding to each frame of the original image, and performing a superposition of the original image and the interference image so as to acquire an mixed image and then transmit the mixed image to a time-controller; and by the time controller, processing the mixed image and then transmitting data signal and gate signal to a source driver IC and a gate driver IC, respectively, so as to drive the first type of sub-pixel units to display each frame of the original image and drive the second type of sub-pixel units to display the anti-color image corresponding to each frame of the original image, wherein, anti-color image signal of the image signal of the original image is used as the image data signal of the interference image, the largest gray value of an image is 255, and when the gray value of the original image displayed by the first type of sub-pixel units is set as X, the gray value of the interference image displayed by the second type of sub-pixel units is set as (255-X).

* * * * *